United States Patent [19]

Dydyk

[11] Patent Number: 4,600,894
[45] Date of Patent: Jul. 15, 1986

[54] PLANAR RADIAL RESONATOR OSCILLATOR/AMPLIFIER

[75] Inventor: Michael Dydyk, Scottsdale, Ariz.

[73] Assignee: Motorola, Inc., Schaumburg, Ill.

[21] Appl. No.: 644,848

[22] Filed: Aug. 27, 1984

[51] Int. Cl.$^4$ ................................................ H03F 3/60
[52] U.S. Cl. ..................................... 330/287; 331/96; 331/107 SL
[58] Field of Search ................. 330/286, 287, 53; 331/96, 101, 107 DP, 107 SL, 107 C; 333/219

[56] References Cited

U.S. PATENT DOCUMENTS

| | | | |
|---|---|---|---|
| 3,639,857 | 2/1972 | Okoshi et al. | 331/107 SL |
| 3,716,809 | 2/1973 | Reeder et al. | |
| 4,016,506 | 4/1977 | Kofol | 331/107 SL X |
| 4,431,974 | 2/1984 | Landt | 331/107 SL X |

Primary Examiner—Eugene R. LaRoche
Assistant Examiner—Steven J. Mottola
Attorney, Agent, or Firm—Raymond J. Warren

[57] ABSTRACT

An apparatus and method is disclosed for providing a planar disc resonator oscillator/amplifier which consists of a planar radial disc resonator, a substrate having a hole extending therethrough, a negative impedance device, and a conductor having a predetermined width. The oscillator/amplifier having an external quality factor dependent upon the width of the conductor and upon the distance between the centers of the planar radial disc resonator and the negative impedance device.

13 Claims, 4 Drawing Figures

PLANAR RADIAL RESONATOR OSCILLATOR/AMPLIFIER

BACKGROUND OF THE INVENTION

1. Field of the Invention

This invention relates, in general, to resonator oscillator/amplifiers and, more particularly, to planar radial resonator oscillator/amplifiers.

2. Description of the Background

While planar resonators are known in the art, see J. Watkins, "Circular Resonant Structures in Microstrip", Elec. letters, Vol. 5, pp. 524–525, Oct. 16, 1969, there are no previously known planar radial resonators oscillator/amplifiers. The present oscillator/amplifiers have only one degree of freedom such that when the output coupling coefficient is selected the external quality factor is set thereby determining all other parameters.

SUMMARY OF THE INVENTION

Accordingly, it is an object of the present invention to provide a planar radial resonator oscillator/amplifier and method having an improved efficiency.

A further object of the present invention is to provide a planar radial resonator oscillator/amplifier and method having a selectable external quality factor ($Q_{ext}$).

Still another object of the present invention is to provide a planar radial resonator oscillator/amplifier and method being more cost-effective.

Yet another object of the present invention is to provide a planar radial resonator oscillator/amplifier and method to operate in microwave/millimeter-wave systems.

Yet another object of the present invention is to provide a planar radial resonator oscillator/amplifior and method having two degrees of freedom.

The above and other objects and advantages of the present invention are provided by an apparatus and method of utilizing a planar radial disc resonator.

A particular embodiment of the present invention utilizes a planar disc resonator oscillator/amplifier, a substrate having a hole extending therethrough, a negative impedance device, and conductor having a predetermined width. The oscillator/amplifier has an external quality factor dependent upon the width of the conductor and a real part of the input impedance dependent upon the width of the conductor and the distance between the center of the planar radial disc resonator and the negative impedance devices.

DETAILED DESCRIPTION OF THE DRAWINGS

Figure 1:
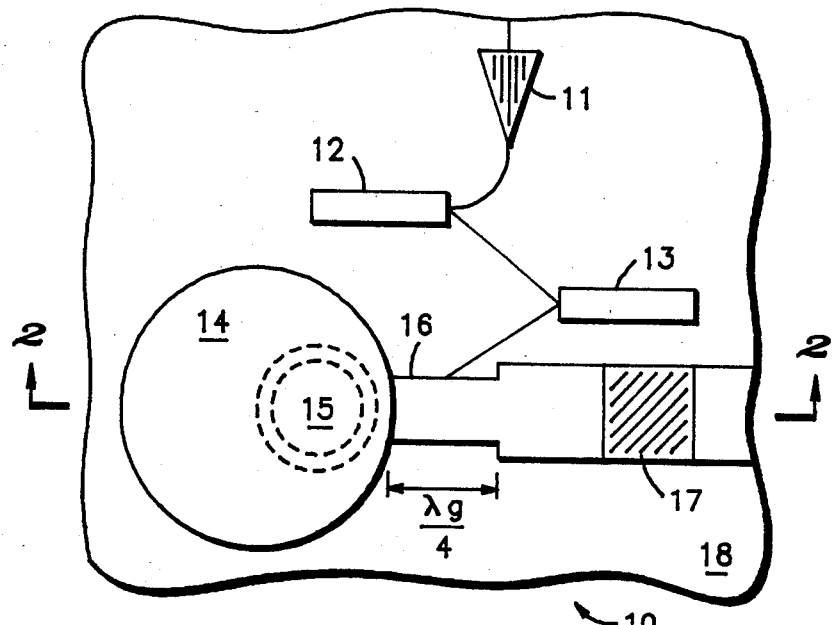
FIG. 1 is a top view of a resonator oscillator/amplifier circuit embodying the present invention.

Referring now to FIG. 1 a top view of a resonator oscillator/amplifier circuit embodying the present invention, generally designated 10, is illustrated. Circuit 10 is mounted on a dielectric substrate 18, and has a stabilizing load 11, filter elements 12 and 13, a radial disc resonator 14, a negative impedance device such as an IMPATT diode 15, a micro-strip conductor 16, and a capacitor 17. Resonator 14 and conductor 16 are formed of a conductive material, such as copper or the like, and are affixed to the surface of substrate 18 by any well known method, such as used in the construction of printed circuits. As the bias circuit (11, 12 and 13) and the beam lead capacitor (17) in the output, which might be utilized herein, are well known in the art, these will not be discussed. The following discussion of this invention defines the relation of the radial disc resonator to the diode and the radial disc resonator to the micro-strip conductor which will be discussed in detail below.

Figure 2:
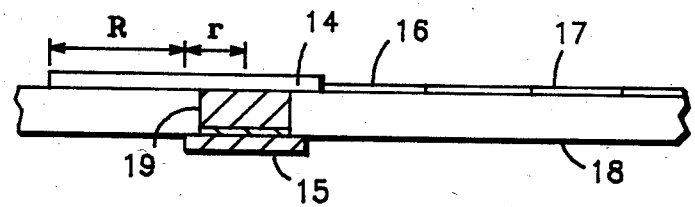
FIG. 2 is a cross sectional view of the resonator oscillator/amplifier circuit as seen from the line 2—2 in FIG. 1.

Referring now to FIG. 2 a cross sectional view of the resonator oscillator/amplifier circuit 10, is illustrated. Disc 14 is illustrated mounted above a dielectric substrate 18 and having a radius, R. A hole 19 is located below disc 14 through substrate 18. Diode 15 is located in hole 19 opposite disc 14. The input coupling to diode 15 can be controlled with the separation, r, between the centers of disc 14 and diode 15, which will be discussed in detail below.

Figure 3:
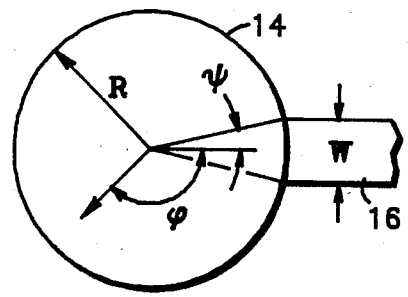
FIG. 3 is a partial top view of the resonator oscillator/amplifier circuit illustrated in FIG. 1, showing various parameters.

Referring now to FIG. 3 a partial top view of the resonator oscillator/amplifier circuit, 10 is illustrated. Here disc 14 is shown coupled to micro-script 16. The output coupling coefficient is controlled by the width of conductor 16, which will be discussed below.

The validity of the above statements and the dependency of the input and output coupling coefficients will be determined analytically below. The radial disc resonator has a diameter, D, defined by, $$D = \frac{1.84 \lambda_o}{\pi \sqrt{\epsilon_r}} \tag{1}$$

where:

$\lambda_o$ = the frequency of the signal, $\epsilon_r$ = the relative permitivity of the substrate, and where all other variables are as defined above. The quality factor, $Q_o$, of the radial disc resonator is defined by, $$Q_o = \frac{1}{\left(\frac{\pi}{\lambda_o} \frac{\eta_o h}{R_s}\right)^{-1} + \tan\delta} \tag{2}$$

where:

$\eta_o$ = the free space impedance, $R_s$ = the resistivity, $\tan\delta$ = the loss tangent of the material, h = the height of the dielectric material, and where all other variables are as defined above.

To determine the input coupling coefficient, $\beta_1$, a coax transmission media may be substituted for the diode, with the inner conductor of the coax extending into the radial disc. Where the height of the dielectric material, h, is substantially smaller than a quarter wavelength the current in the inner conductor is practically uniform and in the direction parallel to the h field which is substantially uniform. Under these conditions the resonator will operate in the dominant mode. The electric and magnetic field configurations in this mode have no variations in the axial or azimuthal direction and are represented by equations:

$$E_z = k^2 J_1(kr) \cos(\theta + \phi), \text{ and} \tag{3}$$

$$H_\phi = j\omega\epsilon k J_1'(kr) \cos(\theta + \phi) \tag{4}$$

Equation (3) represents the axial electric field where:
$k = \omega^2 \mu_o \epsilon$, dependent upon the material and frequency of the resonator,
$\mu_o$ = permeability of the substrate material,
$\omega$ = the frequency of the signal,
$J_1(kr)$ = a first order Bessel function of the first kind,
$\theta$ and $\phi$ = the cylindrical coordinates, and where all other variables are as defined above. Equation (4) represents the radial magnetic field, H, where:
$\epsilon$ = the general permitivity represented by $\epsilon = \epsilon_r \epsilon_o$, and
where all other variables are as defined above.

Figure 4:
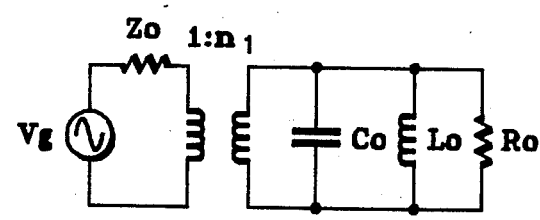
FIG. 4 is a schematic diagram of a simplified equivalent circuit of a resonator loading a generator used to determine an input coupling coefficient, $\beta_1$.

Using a shunt transformer coupled representation with dissipation, the input impedance, $Z_{in}$ to the resonator is, $$Z_{in} = \frac{j}{n_1^2 C_o \left[ \omega_o^2 - \omega^2 + j \frac{\omega_o \omega}{Q_o} \right]} \tag{5}$$

where:
$C_o$ = the capacitance of the circuit and $$n_1^2 C_o = \frac{2E}{V^2} \tag{6}$$

where:
V = the voltage at the terminal where the resonator excites the diode, and where all other variables are as defined above. For the mode of interest, $$E = \epsilon k^4 h \pi \frac{R^2}{2} J_o^2(kR)[(kR)^2 - 1] \tag{7}$$

and $$V = hk^2 J_1 \left( k \frac{r}{R} \right) \cos(\theta + \phi) \tag{8}$$

where the variables are as defined above. Substituting equations (6), (7) and (8) into equation (5) and evaluating for $\omega = \omega_O$ gives:

$$Z_{IN}|_{\omega=\omega_O} = \frac{R_o}{n_1^2} = \frac{Q_o \lambda_o h \eta_o \cos^2(\theta + \phi)}{2\pi^2 R^2 [(kR)^2 - 1]} \left[ \frac{J_1(kR)}{J_o\left(k\frac{r}{R}\right)} \right]^2 \tag{9}$$

where the variables are as defined above. In order to relate the input impedance $(R_o/n_1^2)$ to the input coupling coefficient, an equivalent circuit as illustrated in FIG. 4 will be used. A loaded Q, $Q_L$, for this system is defined by, $$Q_L = \frac{C_o \omega}{\frac{1}{R_o} + \frac{1}{n_1^2 Z_o}} = \frac{Q_o}{1 + \frac{R_o}{n_1^2 Z_o}} \tag{10}$$

where:
$R_o$ = the input resistance of the circuit as illustrated in FIG. 4,
$Z_O$ = the generator impedance such as illustrated in FIG. 4, and
where all other variables are as defined above. The input coefficient, $\beta_1$, is by definition, $$\beta_1 = \frac{R_o}{n_1^2 Z_o} = \frac{Q_o \lambda_o h_o \cos^2(\theta + \phi)}{2\pi^2 R^2 Z_o [(kR)^2 - 1]} \left[ \frac{J_1\left(k\frac{r}{R}\right)}{J_o(kR)} \right]^2 \tag{11}$$

where the variables are as defined above. As shown by equation (11) the input coefficient, $\beta_1$, can be controlled with the separation between the centers of disc 14 and diode 15 and will be a minimum where the distance, r, between the centers of disc 14 and diode 15, is zero.

Now, the output coupling coefficient, $\beta_2$, which is dependent upon the width, W, of the conductor as shown in FIG. 3, will be determined. It will be assumed that $E_z$ has a co-sinusoidal distribution with one period around the periphery of the disc. The electric field, $E_z$, at the edge of the disc is given by the equation, $$E_z = A_1 J_1(kR) \cos \phi \tag{12}$$

where:
$A_1$ = a constant, and where all other variables are as defined above. It will also be assumed that the tangential component of the magnetic field, H, at a radius r = R is a constant over the width, W, of the conductor and zero elsewhere. The components of the magnetic field may be represented by a Fourier series, $$H(R,\phi) = \frac{H_1 \Psi}{\pi} + 2H_1 \sum_{n=1}^{\infty} \frac{\sin n\Psi}{n\pi} \cos \phi \tag{13}$$

where:
$\Psi$ = the angle illustrated in FIG. 3 and is defined by, $$\sin \psi = \frac{W}{2R} \tag{14}$$

and where all other variables are as defined above. The magnetic field, H, may also be solved by using Maxwells equations and is illustrated by, $$H_\phi = \frac{j}{\omega \mu_o} \frac{\partial E_z}{\partial r} = jY_e J_1'(kR) \cos \phi A_1 \tag{15}$$

where:
$Y_e$ = the admittance of the circuit which may be defined by, $$Y_e = \sqrt{\frac{\epsilon_o \epsilon_r}{\mu_o}} \tag{16}$$

and where all other variables are as defined above. Equating equation (13), for n=1 with equation (15) and solving for $A_1$ the result becomes, $$A_1 = -j \frac{2H_1 \sin \psi}{\pi Y_e J_1'(kR)} \quad (17)$$

where the variables are as defined above. Substituting equation (17) into equation (12) gives the electric field as, $$E_z = \frac{-j2H_1 \sin \Psi}{\pi Y_e} \left[ \frac{J_1(kR)}{J_1'(kR)} \right] \cos \phi \quad (18)$$

where the variables are as defined above. The input-admittance, $Y_{in}$, at $\phi=0$ is then given by, $$Y_{in} = \frac{H_\phi}{E_z} = j \frac{\pi Y_e}{2 \sin \Psi} \left[ \frac{J_1'(kR)}{J_1(kR)} \right] = j B_{in} \quad (19)$$

where:

$B_{in}$ = the susceptance or imaginary value of the emittance $Y_{in}$, and where all other variables are as defined above.

This can now be solved for the external quality factor, $Q_{ext}$, $$Q_{ext} = \frac{\omega_o}{2Y_o} \left. \frac{\partial B_{in}}{\partial \omega} \right|_{\omega = \omega_o} = \left( \frac{\pi Y_e}{4 Y_o \sin \Psi} \right) \left( \frac{(kR)^2 - 1}{kR} \right) \quad (20)$$

where the variables are as defined above. Next, the output coefficient, $\beta_2$, can be solved by utilizing its definition, $$\beta_2 = \frac{Q_o}{Q_{ext}} = \frac{4 Q_o Y_o \sin \Psi}{\pi Y_e} \left[ \frac{kR}{(kR)^2 - 1} \right] \quad (21)$$

where the variables are as defined above. Equation (21) illustrates that $\beta_2$ is dependent upon $\sin \Psi$ which is dependent upon W, equation (14).

The above discussion shows that the present device provides a resonator oscillator/amplifier having two degrees of freedom. Once $\beta_2$ or $Q_{ext}$ are selected the real part of the input impedance may still be varied by selecting an appropriate input coefficient, $\beta_1$. In other words the real part of the input impedance is not determined solely by assigning a value to output coefficient, $\beta_2$.

This analytical analysis has been verified experimentally producing the expected results.

Thus, it is apparent that there has been provided in accordance with the invention, a device and method that fully satisfied the objects, aims and advantages set forth above.

It has also been shown that the present invention provides an improved efficiency through having a selectable external quality factor ($Q_{ext}$) and will operate on a microwave/millimeter wave system. It has further been shown that the present invention provides a device having two degrees of freedom.

While the invention has been described in conjunction with specific embodiments thereof, it is evident that many alterations, modifications and variations will be apparent to those skilled in the art in light of the foregoing description.

I claim:

1. A resonator oscillator/amplifier device comprising:
   a planar substrate having opposed surfaces with a hole extending therebetween;
   a radial disc having a center, said radial disc being mounted on one of the surfaces of said substrate and covering the hole through said substrate;
   a negative impedance device having a center and being coupled to the hole of said substrate opposite said radial disc;
   a conductor having a width that establishes the output coupling which determines an external quality coefficient ($Q_{ext}$), said conductor being coupled to said radial disc; and
   an input coupling coefficient dependent upon the relative position of the centers of the radial disk and the negative impedance device.

2. The device of claim 1 wherein said input coupling coefficient, $\beta_1$, dependent on a distance, r, between said centers of said radial disc and said negative impedance device, is defined by the equation.

$$\beta_1 = \frac{R_o}{n_1^2 Z_o} = \frac{Q_o \lambda_o h \eta_o \cos^2(\theta + \phi)}{2\pi^2 R^2 Z_o [(kR)^2 - 1]} \left[ \frac{J_1\left(k\frac{r}{R}\right)}{J_o(kR)} \right]^2$$

where $Q_o$ = the internal quality factor of said resonator,
$\lambda_o$ = the frequency of said resonator,
h = a height of said substrate,
$\eta_o$ = the free space impedance,
$\theta$ and $\phi$ = the cylindrical coordinates,
R = the radius of said radial disc,
$Z_o$ = the generator characteristic impedance,
k = $\omega \mu_o \epsilon$ dependent upon the material and the frequency of said resonator oscillator/amplifier, where $\omega$ is the radial frequency of a signal, $\mu_o$, is the permeability of the substrate, and $\epsilon$ is the general permitivity,
r = the distance between said center of said radial disc and said center of said negative resistance device,
$R_o$ = the loss contribution due to the intrinsic resonator (the input resistance),
$n_1$ = the coefficient of transformation between said negative impedance device and said radial disc,
$J_1(kr/R)$ = a Bessel function of the first kind of order one, and
$J_o(kR)$ = a Bessel function of the first kind of order zero.

3. The device of claim 1 wherein the device has an output coefficient dependent upon said width of said conductor.

4. The device of claim 3 wherein said output coupling coefficient, $\beta_2$, dependent upon said width, W, of said conductor, is defined by, $$\beta_2 = \frac{Q_o}{Q_{ext}} = \frac{4 Q_o Y_o \sin \Psi}{\pi Y_e} \left[ \frac{kR}{(kR)^2 - 1} \right]$$

where:

$Q_o$ = the internal quality factor of said resonator;
$Q_{ext}$ = the external quality factor;

$\Psi$ = angle designated by (W/2R) where W is said width of said conductor;
$Y_o$ = the emittance of said resonator;
$k = \omega\mu_o\epsilon$, dependent on the material and frequency of said resonator; where $\omega$ is the radial frequency of a signal, $\mu_o$, is the permeability of the substrate material, and $\epsilon$ is the general permitivity;
R = the radius of said radial disc; and
$Y_e$ = the characteristic wave emittance of said resonator.

5. The device of claim 4 further comprising an external quality factor, $Q_{(ext)}$, said external quality factor being dependent upon said output coupling coefficient, $\beta_2$, said external quality factor being defined by, $$Q_{(ext)} = \frac{Q_o}{\beta_2}$$

where:
$Q_o$ = the internal quality factor of a resonator of said resonator oscillator/amplifier device.

6. The device of claim 5 further comprising a real part of an input impedance, $R_e[Z_{in}]$ (as seen by the active device), said real part of said input impedance being dependent upon said input, $\beta_1$, and output, $\beta_2$, coupling coefficients, said real part of said input impedance being defined by $$R_e[Z_{in}] = \frac{Z_o\beta_1}{1 + \beta_2}$$

where:
$Z_o$ = a load impedance attached to said resonator/amplifier device.

7. A method of optimizing an external quality factor of a resonator oscillator/amplifier device comprising a substrate having a hole extending therethrough, a radial resonator having a center, said radial resonator being mounted to cover the hole of said substrate, a negative impedance device having a center and being coupled to the hole of said substrate opposite said radial resonator, and a conductor having a predetermined width and being coupled to said radial resonator, comprising of the steps of:
varying the distance between the centers of said radial resonator and said negative impedance device; and
varying the width of said conductor.

8. A resonator oscillator/amplifier device comprising:
a substrate having a hole extending therethrough;
a radial disc resonator having a center, said radial disc resonator being mounted to a first side of said substrate covering the hole of said substrate;
a negative impedance device having a center and being coupled to the hole of said substrate opposite said radial resonator; and
an input coupling coefficient dependent upon the relative position of the centers of the radial disk and the negative impedance device.

9. The device of claim 8 further comprising a conductor having a width that establishes the output coupling which determines an external quality coefficient ($Q_{ext}$) and said conductor being coupled to said radial disc resonator.

10. The device of claim 9 further comprising an input coupling coefficient, $\beta_1$, said coupling coefficient being dependent on a distance, r, between said centers of said radial disc and said negative impedance device, said input coupling coefficient being defined by the equation $$\beta_1 = \frac{R_o}{n_1^2 Z_o} = \frac{Q_o \lambda_o h \eta_o \cos^2(\theta + \phi)}{2\pi^2 R^2 Z_o[(kR)^2 - 1]} \left[\frac{J_1\left(k\frac{r}{R}\right)}{J_o(kR)}\right]^2$$

where
$Q_o$ = the internal quality factor of said resonator,
$\lambda_o$ = the wavelength at which said resonator operates,
h = a height of said substrate,
$\eta_o$ = the free space impedance,
$\theta$ and $\phi$ = the cylindrical coordinates,
R = the radius of said radial disc,
$Z_o$ = the generator characteristic impedance,
$k = \omega^2\mu_o\epsilon$, dependent upon the material and the frequency of said resonator oscillator/amplifier, where $\omega$ is the radial frequency of a signal, $\mu_o$, is the permeability of said substrate material, and $\epsilon$ is the general permitivity,
r = the distance between said center of said radial disc and said center of said resistance device,
$R_o$ = the loss contribution due to the intrinsic resonator (or input resistance),
$n_1$ = the coefficient of transformation between said negative impedance device and said radial disc,
$J_1(kr/R)$ = a Bessel function of the first kind of order one, and
$J_o(kR)$ = a Bessel function of the first kind of order zero.

11. The device of claim 10 further comprising an output coupling coefficient, $\beta_2$, said output coupling coefficient being dependent upon width, W, of said conductor, said output coupling coefficient being defined by, $$\beta_2 = \frac{Q_o}{Q_{ext}} = \frac{4 Q_o Y_o \sin\Psi}{\pi Y_e} \left[\frac{kR}{(kR)^2 - 1}\right].$$

where:
$Q_o$ = the internal quality factor of said resonator;
$Q_{ext}$ = the external quality factor;
$\Psi$ = an angle described by (W/2R) where W is said width of said conductor;
$Y_o$ = the generator characteristic emittance;
$k = \omega^2\mu_o\epsilon$, dependent on the material and frequency of said resonator, where $\omega$ is the radial frequency of a signal, $\mu_o$, is the permeability of the substrate, and $\epsilon$ is the general permitivity;
R = the radius of said radial disc; and
$Y_e$ = the characteristic wave emittance of said resonator.

12. The device of claim 11 further comprising an external quality factor, $Q_{(ext)}$, said external quality factor being dependent upon said output, $\beta_2$, coupling coefficient, said external quality factor being defined by, $$Q_{(ext)} = \frac{Q_o}{\beta_2}$$

where:

$Q_o$ = the internal quality factor of a resonator of said resonator oscillator/amplifier device.

13. The device of claim 12 further comprising a real part of an input impedance, $R_e[Z_{in}]$, said real part of said input impedance being dependent upon said input, $\beta_1$, and output, $\beta_2$, coupling coefficients, said real part of said input impedance being defined by $$R_e[Z_{in}] = \frac{Z_o \beta_1}{1 + \beta_2}$$

* * * * *